United States Patent
Sekiguchi et al.

(10) Patent No.: US 8,823,186 B2
(45) Date of Patent: Sep. 2, 2014

(54) FIBER-CONTAINING RESIN SUBSTRATE, SEALED SUBSTRATE HAVING SEMICONDUCTOR DEVICE MOUNTED THEREON, SEALED WAFER HAVING SEMICONDUCTOR DEVICE FORMED THEREON, A SEMICONDUCTOR APPARATUS, AND METHOD FOR MANUFACTURING SEMICONDUCTOR APPARATUS

(75) Inventors: Susumu Sekiguchi, Annaka (JP); Toshio Shiobara, Tokyo (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 7 days.

(21) Appl. No.: 13/301,035

(22) Filed: Nov. 21, 2011

(65) Prior Publication Data

US 2012/0161339 A1    Jun. 28, 2012

(30) Foreign Application Priority Data

Dec. 27, 2010    (JP) .................................. 2010-289900

(51) Int. Cl.
*H01L 23/29* (2006.01)

(52) U.S. Cl.
USPC ....................................................... 257/791

(58) Field of Classification Search
CPC ........... H01L 2924/19041; H01L 2924/01079; H01L 2224/48247
USPC .......... 257/791, 793, 787, 788, 789, 790, 795
See application file for complete search history.

(56) References Cited

U.S. PATENT DOCUMENTS

2003/0127750 A1    7/2003   Hacke et al.
2010/0270059 A1 *  10/2010  Takeuchi et al. .............. 174/254

FOREIGN PATENT DOCUMENTS

| JP | A-2002-179885 | 6/2002 |
|----|---------------|--------|
| JP | A-2004-504723 | 2/2004 |
| JP | A-2007-001266 | 1/2007 |
| JP | A-2009-060146 | 3/2009 |

* cited by examiner

*Primary Examiner* — Hoa B Trinh
(74) *Attorney, Agent, or Firm* — Oliff PLC

(57) ABSTRACT

A fiber-containing resin substrate for collectively sealing a semiconductor devices mounting surface of a substrate having the semiconductor devices mounted thereon or a semiconductor devices forming surface of a wafer having semiconductor devices formed thereon, includes: a resin-impregnated fiber base material obtained by impregnating a fiber base material with a thermosetting resin and semi-curing or curing the thermosetting resin; and an uncured resin layer containing an uncured thermosetting resin and formed on one side of the resin-impregnated fiber base material. There can be a fiber-containing resin substrate that enables suppressing warp of a wafer and delamination of semiconductor devices even though a large-diameter wafer or a large-diameter substrate made of a metal and the like is sealed, enables collectively sealing a semiconductor devices mounting surface of the substrate or a semiconductor devices forming surface of the wafer, and has excellent heat resistance or moisture resistance after sealing.

8 Claims, 4 Drawing Sheets

(A) COVERING STEP (B) SEALING STEP (C) PIECE FORMING STEP (D)

FIBER-CONTAINING RESIN SUBSTRATE, SEALED SUBSTRATE HAVING SEMICONDUCTOR DEVICE MOUNTED THEREON, SEALED WAFER HAVING SEMICONDUCTOR DEVICE FORMED THEREON, A SEMICONDUCTOR APPARATUS, AND METHOD FOR MANUFACTURING SEMICONDUCTOR APPARATUS

BACKGROUND OF THE INVENTION

1. Field of the Invention

The present invention relates to a sealing material that enables collective sealing on a wafer level, and more particularly to a sealing material having a substrate-like shape, and also relates to a substrate having the semiconductor devices mounted thereon and a wafer having semiconductor devices formed thereon which are sealed with the substrate-like sealing material, a semiconductor apparatus obtained by forming the substrate having the semiconductor devices mounted thereon and the wafer having the semiconductor devices formed thereon into pieces, and a method for manufacturing a semiconductor apparatus using the substrate-like sealing material.

2. Description of the Related Art

In regard to wafer-level sealing for a semiconductor devices mounting surface of a substrate having the semiconductor devices mounted thereon or a semiconductor devices forming surface of a wafer having semiconductor devices formed thereon, various kinds of methods have been conventionally suggested and examined, and there are sealing based on spin coating, sealing based on screen printing (Japanese Unexamined Patent Application Publication No. 2002-179885), and a method using a composite sheet obtained by coating a film support with a hot-melt epoxy resin (Japanese Unexamined Patent Application Publication No. 2009-60146 and Japanese Unexamined Patent Application Publication No. 2007-001266) as examples of such methods.

Among others, as a wafer-level sealing method for a semiconductor devices mounting surface of a substrate having semiconductor devices mounted thereon, a method that has been recently put into commercial production comprises attaching a film having a double-side adhesive layer to an upper portion of a metal, a silicon wafer, or a glass substrate and the like, or applying an adhesive to an upper portion of the substrate by spin coating and the like, then arranging, bonding, and mounting semiconductor devices on the substrate to provide the semiconductor devices mounting surface, and thereafter performing pressure forming and sealing while heating using, e.g., a liquid epoxy resin or an epoxy molding compound, thereby sealing the semiconductor devices mounting surface (Japanese Unexamined Patent Application Publication (Translation of PCT Application) No. 2004-504723). Further, likewise, as a wafer-level sealing method for a semiconductor devices forming surface of a wafer having semiconductor devices formed thereon, a method that has been recently put into commercial production comprises performing pressure forming and sealing while heating using, e.g., the liquid epoxy resin or the epoxy molding compound, thereby sealing the semiconductor devices mounting surface.

However, according to the above-described methods, the sealing can be performed without serious problems when a small-diameter wafer or a small-diameter substrate made of, e.g., a metal of approximately 200 mm (8 inches) is used, but a serious problem is that the substrate or the wafer warps due to contraction stress of an epoxy resin and the like at the time of the sealing and curing when a large-diameter substrate having semiconductor devices mounted thereon or a large-diameter wafer having semiconductor devices formed thereon of 300 mm (12 inches) or above is sealed. Furthermore, when sealing a semiconductor devices mounting surface of the large-diameter substrate having the semiconductor devices mounted thereon on the wafer level, there arises a problem that the semiconductor devices is delaminated from the substrate of a metal and the like due to the contraction stress of, e.g., the epoxy resin at the time of the sealing and curing, and hence a serious problem is that mass production is impossible.

A method for solving the problems involved by an increase in diameter of the substrate having the semiconductor devices mounted thereon or the wafer having the semiconductor devices formed thereon as described above is to fill a sealing resin composition with nearly 90 wt % of a filler or reduce the contraction stress at the time of curing based on realization of low elasticity of the sealing resin composition (Japanese Unexamined Patent Application Publication No. 2002-179885, Japanese Unexamined Patent Application Publication No. 2009-60146, and Japanese Unexamined Patent Application Publication No. 2007-001266).

However, there newly arises a problem that, when filling with nearly 90 wt % of the filler, viscosity of the sealing resin composition increases, and force is applied the semiconductor devices mounted on the substrate at the time of casting, molding and sealing of the sealing resin composition, whereby the semiconductor devices is delaminated from the substrate. Moreover, when the elasticity of the sealing resin is lowered, the warp of the sealed substrate having the semiconductor devices mounted thereon or the sealed wafer having the semiconductor devices formed thereon can be improved, but a reduction in sealing performance, e.g., heat resistance or moisture resistance newly occurs. Therefore, these solving methods cannot obtain fundamental solutions. Therefore, there has been demanded a sealing material which can collectively seal a semiconductor devices mounting surface of a substrate having the semiconductor devices mounted thereon or a semiconductor devices forming surface of a wafer having semiconductor devices formed thereon on a wafer level without occurrence of warp of the substrate or the wafer or delamination of the semiconductor devices from the substrate made of, e.g., a metal even though the large-diameter wafer or large-diameter substrate made of a metal and the like is sealed and which has excellent sealing performance, e.g., heat resistance or moisture resistance after the sealing.

SUMMARY OF THE INVENTION

In view of the above-described problems, it is an object of the present invention to provide a fiber-containing resin substrate that enables suppressing warp of a substrate or a wafer and delamination of semiconductor devices from the substrate even though the large-diameter wafer or the large-diameter substrate made of a metal and the like is sealed, enables collectively sealing a semiconductor devices mounting surface of the substrate having the semiconductor devices mounted thereon or a semiconductor devices forming surface of the wafer having the semiconductor devices formed thereon on the wafer level, and has excellent sealing performance such as heat resistance or moisture resistance after sealing and very high general versatility. Additionally, it is another object of the present invention to provide a sealed substrate having the semiconductor devices mounted thereon and a sealed wafer having the semiconductor devices formed thereon which are sealed with the fiber-containing resin substrate, a semiconductor apparatus obtained by dividing the sealed substrate having the semiconductor devices mounted thereon and the sealed wafer having the semiconductor devices formed thereon into pieces, and a method for manufacturing a semiconductor apparatus using the fiber-containing resin substrate.

To solve the problems, according to the present invention, there is provided a fiber-containing resin substrate for collectively sealing at least a semiconductor devices mounting surface of a substrate having the semiconductor devices mounted thereon or a semiconductor devices forming surface of a wafer having semiconductor devices formed thereon, comprising:

a resin-impregnated fiber base material obtained by impregnating a fiber base material with a thermosetting resin and semi-curing or curing the thermosetting resin; and an uncured resin layer containing an uncured thermosetting resin and formed on one side of the resin-impregnated fiber base material.

As described above, in the fiber-containing resin substrate having the resin-impregnated fiber base material obtained by impregnating the fiber base material with the thermosetting resin and semi-curing or curing the thermosetting resin and the uncured resin layer containing the uncured thermosetting resin and formed on one side of the resin-impregnated fiber base material, since the resin-impregnated fiber base material having a very small expansion coefficient can suppress contraction stress of the uncured resin layer at the time of sealing and curing, warp of the substrate or the wafer and delamination of the semiconductor devices from the substrate can be suppressed even though the large-diameter wafer or the large-diameter substrate made of a metal and the like is sealed, the semiconductor devices mounting surface of the substrate having the semiconductor devices mounted thereon or the semiconductor devices forming surface of the wafer having the semiconductor devices formed thereon can be collectively sealed on a wafer level, and the fiber-containing resin substrate having excellent sealing performance such as heat resistance or moisture resistance after the sealing and having very high general versatility can be provided.

Further, it is preferable for an expansion coefficient of the resin-impregnated fiber base material in an X-Y direction to be not lower than 3 ppm and not greater than 15 ppm.

As described above, when the expansion coefficient of the resin-impregnated fiber base material in the X-Y direction is not lower than 3 ppm and not greater than 15 ppm, a difference from the expansion coefficient of the substrate having the semiconductor devices mounted thereon or the wafer having the semiconductor devices formed thereon become small, and warp of the substrate or the wafer to be sealed and delamination of the semiconductor devices from the substrate can be thereby more assuredly suppressed, which is preferable.

Furthermore, it is preferable for a thickness of the uncured resin layer to be not smaller than 20 microns ($\mu$m) and not greater than 200 microns (m).

As described above, the thickness of the uncured resin layer that is not smaller than 20 microns is sufficient to seal the semiconductor devices mounting surface of the substrate having the semiconductor devices mounted thereon and the semiconductor devices forming surface of the wafer having the semiconductor devices formed thereon, occurrence of a failure of filling properties caused due to a too small thickness can be preferably suppressed, and the thickness of 200 microns or below enables suppressing an excessively large thickness of the sealed substrate having the semiconductor devices mounted thereon and the sealed wafer having the semiconductor devices formed thereon that have been subjected to the sealing, which is preferable.

Moreover, it is preferable for the uncured resin layer to contain any one of an epoxy resin, a silicone resin, and a mixed resin of epoxy and silicone that are solidified at a temperature less than 50° C. and molten at 50° C. or above and 150° C. or below.

As described above, when the uncured resin layer contains any one of the epoxy resin, the silicone resin, and the mixed resin of epoxy and silicone that are solidified at a temperature that is less than 50° C. and molten at a temperature that is not lower than 50° C. and the not higher than 150° C., since the resin-impregnated fiber base material having a very small expansion coefficient can suppress the contraction stress of the uncured resin layer including such a resin at the time of curing, warp of the substrate or the wafer and delamination of the semiconductor devices from the substrate can be more assuredly suppressed even though the large-diameter wafer or the large-diameter substrate made of a metal and the like is sealed, the fiber-containing resin substrate that can collectively seal the semiconductor devices mounting surface of the substrate having the semiconductor devices mounted thereon or the semiconductor devices forming surface of the wafer having the semiconductor devices formed thereon on the wafer level can be provided, and the fiber-containing resin substrate having the uncured resin layer containing such a resin can be a fiber-containing resin substrate having excellent sealing performance, e.g., heat resistance or moisture resistance after sealing in particular.

Additionally, according to the present invention, there is provided a sealed substrate having semiconductor devices mounted thereon, wherein the sealed substrate having the semiconductor devices mounted thereon is collectively sealed with the fiber-containing resin substrate by covering a semiconductor devices mounting surface of the substrate having the semiconductor devices mounted thereon with the uncured resin layer of the fiber-containing resin substrate and heating and curing the uncured resin layer.

As described above, when the semiconductor devices mounting surface of the substrate having the semiconductor devices mounted thereon is covered with the uncured resin layer of the fiber-containing resin substrate and the uncured resin layer is heated and cured, the sealed substrate having the semiconductor devices mounted thereon, which is collectively sealed with the fiber-containing resin substrate, can be a sealed substrate having semiconductor devices mounted thereon in which occurrence of warp of the substrate or the wafer and delamination of the semiconductor devices from the substrate is suppressed.

Further, according to the present invention, there is provided a sealed wafer having semiconductor devices formed thereon, wherein the sealed wafer having semiconductor devices formed thereon is collectively sealed with the fiber-containing resin substrate by covering a semiconductor devices forming surface of the wafer having the semiconductor devices formed thereon with the uncured resin layer of the fiber-containing resin substrate and heating and curing the uncured resin layer.

As described above, when the semiconductor devices forming surface of the wafer having the semiconductor devices formed thereon is covered with the uncured resin layer of the fiber-containing resin substrate and the uncured resin layer is heated and cured, the sealed wafer having the semiconductor devices formed thereon, which is collectively sealed with the fiber-containing resin substrate, can be a sealed wafer having semiconductor devices formed thereon in which occurrence of warp of the substrate or the wafer and delamination of the semiconductor devices from the substrate is suppressed.

Furthermore, according to the present invention, there is provided a semiconductor apparatus obtained by dicing the sealed substrate having the semiconductor devices mounted thereon or the sealed wafer having semiconductor devices formed thereon into each piece.

As described above, according to the semiconductor apparatus obtained by dicing the sealed substrate having the semiconductor devices mounted thereon or the sealed wafer having the semiconductor devices formed thereon, which is sealed with the fiber-containing resin substrate, into respective pieces, the semiconductor apparatus can be manufactured from the substrate or the wafer that is sealed with the fiber-containing resin substrate having excellent sealing performance such as heat resistance or moisture resistance and suppressed from warping, thereby obtaining the high-quality semiconductor apparatus.

Moreover, according to the present invention, there is provided a method for manufacturing a semiconductor apparatus, comprising:

a covering step of covering a semiconductor devices mounting surface of a substrate having the semiconductor devices mounted thereon or a semiconductor devices forming surface of a wafer having semiconductor devices formed thereon with an uncured resin layer of the fiber-containing resin substrate;

a sealing step of collectively sealing the semiconductor devices mounting surface of the substrate having the semiconductor devices mounted thereon or the semiconductor devices forming surface of the wafer having semiconductor devices formed thereon by heating and curing the uncured resin layer to provide a sealed substrate having the semiconductor devices mounted thereon or a sealed wafer having semiconductor devices formed thereon; and a piece forming step of dicing the sealed substrate having the semiconductor devices mounted thereon or the sealed wafer having semiconductor devices formed thereon into each piece to manufacture the semiconductor apparatus.

According to such a method for manufacturing a semiconductor apparatus, at the covering step, the semiconductor devices mounting surface or the semiconductor devices forming surface can be easily coated with the uncured resin layer of the fiber-containing resins substrate without a filling failure. Additionally, since the fiber-containing resin substrate is used, the resin-impregnated fiber base material can suppress the contraction stress of the uncured resin layer at the time of curing, the semiconductor devices mounting surface or the semiconductor devices forming surface can be thereby collectively sealed at the sealing step, and the sealed substrate having the semiconductor devices mounted thereon or the sealed wafer having semiconductor devices formed thereon in which warp of the substrate or the wafer and delamination of the semiconductor devices from the substrate are suppressed can be obtained even though the thin large-diameter wafer or the thin large-diameter substrate made of a metal and the like is sealed. Further, the semiconductor apparatus can be diced as each piece from the sealed substrate having a semiconductor mounted thereon or the sealed wafer having a semiconductor formed thereon, which is sealed with the fiber-containing resin substrate having excellent sealing performance such as heat resistance or moisture resistance and suppressed from warping at the piece forming step, whereby the method for manufacturing a semiconductor apparatus that enables manufacturing a high-quality semiconductor apparatus can be obtained.

As described above, according to the fiber-containing resin substrate according to the present invention, since the resin-impregnated fiber base material can suppress the contraction stress of the uncured resin layer at the time of curing and sealing, occurrence of warp of the substrate or the wafer or delamination of the semiconductor devices from the substrate made of a metal and the like can be suppressed even though the large-diameter wafer or the large-diameter substrate made of a metal and the like is sealed, the semiconductor devices mounting surface of the substrate having the semiconductor devices mounted thereon or the semiconductor devices forming surface of the wafer having the semiconductor devices formed thereon can be collectively sealed on the wafer level, and the fiber-containing resin substrate having excellent sealing performance, e.g., heat resistance or moisture resistance after the sealing and has very high general versatility can be obtained. Furthermore, the sealed substrate having the semiconductor devices mounted thereon and the sealed wafer having semiconductor devices formed thereon, which is sealed with the fiber-containing resin substrate, has a configuration that occurrence of warp of the substrate or the wafer or delamination of the semiconductor devices from the substrate made of a metal and the like is suppressed. Moreover, there can be provided the high-quality semiconductor apparatus obtained by dividing into each piece the sealed substrate having the semiconductor devices mounted thereon and the sealed wafer having semiconductor devices formed thereon which are sealed with the fiber-containing resin substrate having the excellent sealing performance, e.g., heat resistance or moisture resistance and suppressed from warping. Additionally, the method for manufacturing a semiconductor apparatus using the fiber-containing resin substrate enables manufacturing the high-quality semiconductor apparatus.

DETAILED DESCRIPTION OF THE PREFERRED EMBODIMENTS

Figure 1:
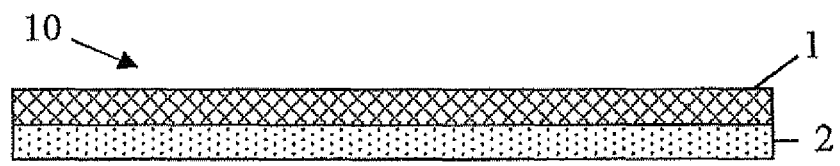
FIG. 1 shows an example of a cross-sectional view of a fiber-containing resin substrate according to the present invention.

Detailed description will now be given as to a fiber-containing resin substrate, a sealed substrate having the semiconductor devices mounted thereon and a sealed wafer having semiconductor devices formed thereon which are sealed with the fiber-containing resin substrate, a semiconductor apparatus obtained by dividing the sealed substrate having the semiconductor devices mounted thereon and the sealed wafer having semiconductor devices formed thereon into each piece, and a method for manufacturing a semiconductor apparatus using the fiber-containing resin substrate according to the present invention, but the present invention is not restricted thereto.

As described above, there has been demanded a highly versatile sealing material that can suppress occurrence of warp of the substrate or the wafer or delamination of the semiconductor devices from the substrate of a metal and the like even though a large-diameter substrate of, e.g., a metal having semiconductor devices mounted thereon or a large-diameter wafer having semiconductor devices formed thereon is sealed, collectively seal a semiconductor devices mounting surface of the substrate having the semiconductor devices mounted thereon or a semiconductor devices forming surface of the wafer having the semiconductor devices formed thereon, and has excellent sealing performance, e.g., heat resistance or moisture resistance after the sealing.

As a result of repeatedly conducting keen examination for achieving the object, the present inventors have discovered that, when a fiber-containing resin substrate having a resin-impregnated fiber base material obtained by impregnating a fiber base material with a thermosetting resin and semi-curing or curing the thermosetting resin and an uncured resin layer containing an uncured resin and formed on one side of the resin-impregnated fiber base material is used, the resin-impregnated fiber base material having a very small expansion coefficient can suppress contraction stress of the uncured resin layer at the time of curing, that warp of the substrate or the wafer or delamination of the semiconductor devices from the substrate can be suppressed by this contraction stress suppressing function even though the large-diameter wafer or the large-diameter substrate made of, e.g., a metal is sealed, and that using the fiber-containing resin substrate according to the present invention enables collectively sealing a semiconductor devices mounting surface of the substrate having the semiconductor devices mounted thereon or a semiconductor devices forming surface of the wafer having the semiconductor devices formed thereon on a wafer level and providing a sealing material having excellent sealing performance, e.g., heat resistance or moisture resistance after sealing and very high general versatility, thereby bringing the fiber-containing resin substrate according to the present invention to completion.

Furthermore, the present inventors has discovered that a sealed substrate having the semiconductor devices mounted thereon and a sealed wafer having semiconductor devices formed thereon, which are collectively sealed with the fiber-containing resin substrate, can be a sealed substrate having the semiconductor devices mounted thereon and a sealed wafer having semiconductor devices formed thereon each having a configuration that occurrence of warp of the substrate or the wafer and delamination of the semiconductor devices from the substrate is suppressed, and that a high-quality semiconductor apparatus can be obtained by dividing the sealed substrate having the semiconductor devices mounted thereon and the sealed wafer having the semiconductor devices formed thereon, in which the warp or the delamination of the semiconductor devices is suppressed as described above, into each piece, thereby bringing the sealed substrate having semiconductor devices mounted thereon, the sealed wafer having semiconductor devices formed thereon, and the semiconductor apparatus to completion.

Moreover, the present inventors have discovered that using the fiber-containing resin substrate enables easily covering the semiconductor devices mounting surface or the semiconductor devices forming surface, that the semiconductor devices mounting surface or the semiconductor devices forming surface can be collectively sealed by heating and curing an uncured resin layer in the fiber-containing resin substrate, and that the high-quality semiconductor apparatus can be manufactured by the dicing into each piece the sealed substrate having the semiconductor devices mounted thereon or the sealed wafer having semiconductor devices formed thereon which is sealed with the fiber-containing resin substrate having excellent sealing performance and configured to suppress warp and delamination of the semiconductor devices, thereby bringing the method for manufacturing a semiconductor apparatus according to the present invention to completion.

According to the present invention, there is provided a fiber-containing resin substrate for collectively sealing at least a semiconductor devices mounting surface of a substrate having the semiconductor devices mounted thereon or a semiconductor devices forming surface of a wafer having the semiconductor devices formed thereon, the fiber-containing resin substrate comprising: a resin-impregnated fiber base material obtained by impregnating a fiber base material with a thermosetting resin and semi-curing or curing the thermosetting resin; and an uncured resin layer containing an uncured thermosetting resin and formed on one side of the resin-impregnated fiber base material.

<Resin-Impregnated Fiber Base Material>

The fiber-containing resin substrate according to the present invention has a resin-impregnated fiber base material. The resin-impregnated fiber base material is obtained by impregnating a fiber base material with a thermosetting resin and semi-curing or curing the thermosetting resin. Since the resin-impregnated fiber base material has a very small expansion coefficient and can suppress contraction stress when curing the later-described uncured resin layer, warp of the substrate or the wafer and delamination of the semiconductor devices from the substrate can be suppressed even though the large-diameter wafer or the large-diameter substrate made of a metal and the like is sealed with the fiber-containing resin substrate according to the present invention.

[Fiber Base Material]

Materials that can be used as the fiber base material are exemplified by carbon fiber, inorganic fiber such as glass fiber, quartz glass fiber, or a metal fiber, organic fiber such as aromatic polyamide fiber, polyimide fiber, or polyamide-imide fiber, silicon carbide fiber, titanium carbide fiber, boron fiber, alumina fiber, and others, and any base material can be used in accordance with product characteristics. Further, the most preferred fiber base materials are exemplified by glass fiber, quartz fiber, carbon fiber, and others. Among others, the glass fiber or the quartz glass fiber having high insulation properties is preferable as the fiber base material.

Conformations of the fiber base material are exemplified by a sheet type such as roving obtained by pulling and aligning long fiber filaments in a fixed direction, fiber cloth, nonwoven cloth, a chop strand mat, and others, but they are not restricted in particular as long as a laminated body can be formed.

[Thermosetting Resin]

Although the thermosetting resin is exemplified by an epoxy resin, a silicone resin, a mixed resin made of the epoxy resin and the silicon resin that are explained below with examples, it is not restricted in particular as long as it is a resin with thermosetting properties that is generally used for sealing semiconductor devices.

[Method for Fabricating Resin-Impregnated Fiber Base Material]

As a method for impregnating the fiber base material with the thermosetting resin, either a solvent method or a hot melt method can be used. The solvent method is a method for adjusting resin varnish obtained by dissolving the thermosetting resin in an organic solvent, impregnating the fiber base material with the resin varnish and then removing the organic solvent by stripping, and the hot melt method is a method for heating and melting the solid thermosetting resin and impregnating the fiber base material with this thermosetting resin.

A method for semi-curing the thermosetting resin with which the fiber base material is impregnated is not restricted in particular, but there is a method for, e.g., performing heating to effect deliquoring of the thermosetting resin with which the fiber base material is impregnated and thereby semi-curing the thermosetting resin, for example. Although a method for curing the thermosetting resin with which the fiber base material is impregnated is not restricted in particular, there is a method for performing heating to cure the thermosetting resin with which the fiber base material is impregnated, for example.

A thickness of the resin-impregnated fiber base material obtained by impregnating the fiber base material with the thermosetting resin and semi-curing or curing the thermosetting resin is determined by a thickness of the fiber base material such as fiber cloth, and a thick resin-impregnated fiber base material is fabricated by increasing the number of sheets of the fiber base material, e.g., the fiber cloth to be used and laminating these sheets.

In the present invention, semi-curing means a B-stage (a curing intermediary body of the thermosetting resin; the resin in this state is softened when heated, and it swells when brought into contact with a given type of solvent, but it is not completely molten or dissolved) state defined in JIS K 6800 "adhesive/adhesion terms".

As a thickness of the resin-impregnated fiber base material, a thickness of 50 microns to 1 mm is preferable and a thickness of 50 microns to 500 microns is more preferable in both cases where the thermosetting resin with which the fiber base material is impregnated is semi-cured and that the same is cured. A thickness of 50 microns or above is preferable since it can suppress deformation caused when the thickness is too small, and a thickness of 1 mm or below is preferable since it can suppress the semiconductor apparatus itself from becoming too thick.

Moreover, as an expansion coefficient of the resin-impregnated fiber base material in an X-Y direction, a value that is not smaller than 3 ppm and not greater than 15 ppm is preferable, and a value that is not smaller than 5 and not greater than 10 ppm is more preferable. When the expansion coefficient of the resin-impregnated fiber base material in the X-Y direction is not smaller than 3 ppm and not greater than 15 ppm, a difference from an expansion coefficient of the substrate having the semiconductor devices mounted thereon or the wafer having semiconductor devices formed thereon can be suppressed from being increased, thereby more assuredly suppressing warp of the substrate or the wafer. It is to be noted that the X-Y direction means a plane direction of the resin-impregnated fiber base material. Additionally, the expansion coefficient in the X-Y direction means an expansion coefficient measured while arbitrarily setting an X axis and a Y axis in the plane direction of the resin-impregnated fiber base material.

The resin-impregnated fiber base material is important in order to reduce warp after collectively sealing the semiconductor devices mounting surface of the substrate having the semiconductor devices mounted thereon or the semiconductor devices forming surface of the wafer having the semiconductor devices formed thereon and to reinforce the substrate having one or more semiconductor devices aligned and bonded thereon. Therefore, the hard and rigid resin-impregnated fiber base material is desirable.

<Uncured Resin Layer>

The fiber-containing resin substrate according to the present invention has an uncured resin layer. The uncured resin layer is made of an uncured thermosetting resin and formed on one side of the resin-impregnated fiber base material. The uncured resin layer serves as a resin layer used for sealing.

It is desirable for the uncured resin layer to have a thickness that is not smaller than 20 microns and not greater than 200 microns. The thickness that is not smaller than 20 microns is sufficient to seal the semiconductor devices mounting surface of the substrate having the semiconductor devices mounted thereon or the semiconductor devices forming surface of the wafer having the semiconductor devices formed thereon and preferable since occurrence of a failure of filling properties caused due to an extremely small thickness can be suppressed, and the thickness that is not greater than 200 microns is desirable since it is possible to suppress an extremely large thickness of the sealed substrate having the semiconductor devices mounted thereon and the sealed wafer having semiconductor devices formed thereon that are sealed.

Although the uncured resin layer is not restricted in particular, an uncured resin layer containing a liquid epoxy resin or a solid epoxy resin, a silicone resin, or a mixed resin made of the epoxy resin and the silicone resin generally used for sealing of semiconductor devices is preferable. In particular, it is preferable for the uncured resin layer to contain any one of the epoxy resin, the silicone resin, and the epoxy-silicone mixed resin that are solidified at a temperature less than 50° C. and molten at a temperature that is not lower than 50° C. and not higher than 150° C.

[Epoxy Resin]

Although the epoxy resin is not restricted in particular, it is exemplified by a bisphenol type epoxy resin such as a bisphenol A epoxy resin, a bisphenol F epoxy resin, 3,3',5,5'-tetramethyl-4,4'-bisphenol type epoxy resin, or 4,4'-bisphenol type epoxy resin, an epoxy resin obtained by hydrogenating an aromatic ring of a phenol novolac-type epoxy resin, a cresol novolac-type epoxy resin, a bisphenol A novolac-type epoxy resin, a naphthalene diol-type epoxy resin, a tris phenylol methane-type epoxy resin, a tetrakis phenylol ethane-type epoxy resin, or a phenol dicyclopentadiene novolac-type epoxy resin, and a known epoxy resin that is liquefied or solidified at a room temperature such as an alicyclic epoxy resin. Moreover, a fixed amount of any other epoxy resin than those described above can be also used together so as not to deteriorate the effect of the present invention.

Since the uncured resin layer containing the epoxy resin serves as the resin layer that seals the semiconductor devices, it is preferable to reduce halogen ions such as chlorine and alkali ions such as sodium as much as possible. 10 ppm or below is desirable for any ions extracted by adding 10 g of a sample to 50 ml of ion-exchange water, leaving it in an over at 120° C. for 20 hours after sealing up, and then performing heating and extraction at 120°.

A hardener for epoxy resins can be contained in the uncured resin layer containing the epoxy resin. As the hardener, it is possible to use, e.g., a phenol novolac resin, various kinds of amine derivatives, an acid anhydride, or an acid anhydride group obtained by partially opening a ring to thereby generate a carboxylic acid. Among others, it is desirable to use the phonol novolac resin in order to assure reliability of the semiconductor apparatus manufactured using the fiber-containing resin substrate according to the present invention. In particular, it is preferable to mix the epoxy resin and the phenol novolac resin in such a manner that a mixing ratio is determined by a ratio of an epoxy group and a phenolic hydroxyl group to be 1:0.8 to 1.3.

Additionally, to facilitate a reaction of the epoxy resin and the hardener, an imidazole derivative, a phosphine derivative, an amine derivative, or a metal compound such as an organic aluminum compound may be used, for example.

Various kinds of additives may be blended in the uncured resin layer containing the epoxy resin as required. For example, for the purpose of improving properties of a resin, it is possible to add and blend various kinds of additives such as thermoplastic resins, thermoplastic elastomers, organic synthetic rubbers, silicon-based low-stress agents, waxes, and halogen trap agents so as not to deteriorate the effect of the present invention.

[Silicone Resin]

As the silicone resin, a thermosetting silicone resin and others can be used. In particular, it is desirable for the uncured resin layer containing the silicone resin to contain an addition-curable silicone resin composition. As the addition-curable silicone resin composition, a composition having (A) an organosilicon compound having a nonconjugated double bond, (B) organohydrogenpolysiloxane, and (C) a platinum-based catalyst as essential components is particularly preferable. The components (A) to (C) will now be described hereinafter.

Component (A): Organosilicon Compound Having Nonconjugated Double Bond

The (A) organosilicon compound having a nonconjugated double bond is exemplified by organopolysiloxane represented by a general formula (1):

$$R^1R^2R^3SiO-(R^4R^5SiO)_a-(R^6R^7SiO)_b-SiR^1R^2R^3$$

wherein $R^1$ represents univalent hydrocarbon group having a nonconjugated double bond, $R^2$ to $R^7$ represent the same or different univalent hydrocarbon groups, and a and b represent integers meeting $0 \leq a \leq 500$, $0 \leq b \leq 250$, and $0 \leq a+b \leq 500$.

In the general formula (1), $R^1$ is the univalent hydrocarbon group having nonconjugated double bond, which is preferably a univalent hydrocarbon group having nonconjugated double bond having an aliphatic unsaturated bond as typified by an alkenyl group having a carbon number 2 to 8 or preferably a carbon number 2 to 6.

In the general formula (1), $R^2$ to $R^7$ are the same or different univalent hydrocarbon groups, which are exemplified by an alkyl group, an alkenyl group, an aryl group, or an aralkyl group each preferably having a carbon number 1 to 20 or more preferably a carbon number 1 to 10. Further, among others, $R^4$ to $R^7$ are univalent hydrocarbon groups excluding the aliphatic unsaturated bond, which are particularly preferably, e.g., an alkyl group, an aryl group, or an aralkyl group having no aliphatic unsaturated bond such as an alkenyl group. Furthermore, among others, $R^6$ and $R^7$ are preferably aromatic univalent hydrocarbon groups or more preferably, e.g., an aryl group having a carbon number 6 to 12 such as a phenyl group or a tolyl group.

In the general formula (1), a and b are the integers meeting $0 \leq a \leq 500$, $0 \leq b \leq 250$, and $0 \leq a+b \leq 500$, a is preferably $10 \leq a \leq 500$, b is preferably $0 \leq b \leq 150$, and a+b preferably meets $10 \leq a+b \leq 500$.

Although organopolysiloxane shown in the general formula (1) can be obtained by an alkali equilibration reaction between cyclic diorganopolysiloxane such as a cyclic diphenylpolysiloxane or a cyclic methylphenylpolysiloxane and disiloxane such as diphenyltetravinyldisiloxane or a divinyltetraphenyldisiloxane to be constituted a terminal group, since a small amount of a catalyst advances polymerization with an irreversible reaction in the equilibration reaction using an alkali catalyst (particularly strong alkali such as KOH), ring-opening polymerization alone quantitatively advances, a terminal blocking ratio is high, and hence a silanol group and a chloride component are not usually contained.

Organopolysiloxane shown in the general formula (1) is specifically exemplified by the following expression:

[Chemical Formula 1]

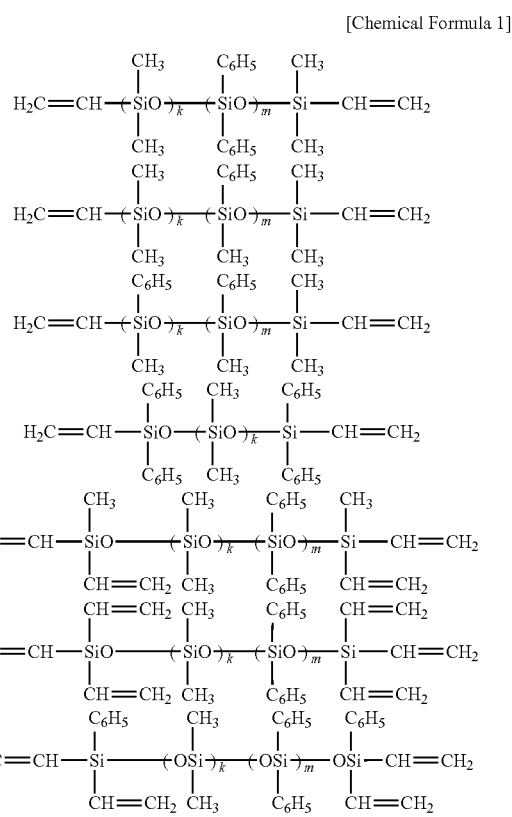

wherein k and m represent integers meeting $0 \leq k \leq 500$, $0 \leq m \leq 250$, and $0 \leq k+m \leq 500$, and preferably integers meeting $5 \leq k+m \leq 250$ and $0 \leq m/(k+m) \leq 0.5$.

As the component (A), besides organopolysiloxane having a straight-chain structure represented by the general formula (1), organopolysiloxane having a three-dimensional network structure including a trifunctional siloxane unit, a tetrafunctional siloxane unit, and the like can be also used. One type of (A) the organosilicon compound having a nonconjugated double bond alone may be used, or two or more types of the same may be mixed and used.

It is preferable for an amount of a group having a nonconjugated double bond in (A) the organosilicon compound having a nonconjugated double bond to be 1 to 50 mol % in all univalent hydrocarbon groups (all univalent hydrocarbon groups bonding to Si atoms), more preferable for the same to be 2 to 40 mol %, or particularly preferable for the same to be 5 to 30 mol %. An excellent cured material can be obtained at the time of curing when an amount of the group having the nonconjugated double bond is not lower than 1 mol %, and mechanical characteristics are excellent at the time of curing when the same is not greater than 50 mol %, which is preferable.

Furthermore, it is preferable for the (A) the organosilicon compound having a nonconjugated double bond to have an aromatic univalent hydrocarbon group (an aromatic univalent hydrocarbon group bonding to an Si atom), and it is preferable for the content of the aromatic univalent hydrocarbon group to be 0 to 95 mol % in all univalent hydrocarbon groups (all univalent hydrocarbon groups bonding to Si atoms), more preferable for the same to be 10 to 90 mol %, or particularly preferable for the same to be 20 to 80 mol %. Including an appropriate amount of the aromatic univalent hydrocarbon group in the resin provides an advantage that mechanical characteristics at the time of curing are excellent and manufacture can be facilitated.

Component (B): Oranohydrogenpolysiloxane

As the component (B), organohydrogenpolysiloxane having two or more hydrogen atoms (SiH groups) bonding to silicon atoms in one molecule is preferable. Organohydrogenpolysiloxane having two or more hydrogen atoms (SiH groups) bonding to silicon atoms in one molecule can function as a cross-linker, and a cured material can be formed by an additional reaction of the SiH group in the component (B) and the group having nonconjugated double bond such as a vinyl group or an alkenyl group in the component (A).

Moreover, it is preferable for (B) organohydrogenpolysiloxane to have an aromatic univalent hydrocarbon group. When (B) organohydrogenpolysiloxane has the aromatic univalent hydrocarbon group in this manner, compatibility with respect to the component (A) can be enhanced. One type of (B) organohydrogenpolysiloxane alone may be used, or two or more types of the same may be mixed and used, and (B) organohydrogenpolysiloxane having the aromatic hydrocarbon group can be contained as a part or all of the component (B).

Although not restricted, (B) organohydrogenpolysiloxane is exemplified by 1,1,3,3-tetramethyldisiloxane, 1,3,5,7-tetramethylcyclotetrasiloxane, tris(dimethylhydrogensiloxy) methylsilane, tris(dimethylhydrogensiloxy)phenylsilane, 1-glysidoxypropyl-1,3,5,7-tetramethylcyclotetrasiloxane, 1,5-glysidoxypropyl-1,3,5,7-tetramethylcyclotetrasiloxane, 1-glysidoxypropyl-5-trimethoxysilylethyl-1,3,5,7-tetramethylcyclotetrasiloxane, double-ended trimethylsiloxy group blocked methylhydrogenpolysiloxane, a double-ended trimethylsiloxy group blocked dimethylsiloxane/methylhydrogensiloxane copolymer, double-ended dimethylhydrogensiloxy group blocked dimethylpolysiloxane, a double-ended dimethylhydrogensiloxy group blocked dimethylsiloxane/methylhydrorgensiloxane copolymer, a double-ended trimethylsiloxy group blocked methylhydrogensiloxane/diphenylsiloxane copolymer, a double-ended trimethylsiloxy group blocked methylhydrogensiloxane/diphenylsiloxane/dimethylsiloxane copolymer, a trimethoxysilane polymer, a copolymer constituted of $(CH_3)_2HSiO_{1/2}$ units and $SiO_{4/2}$ units, a copolymer constituted of $(CH_3)_2HSiO_{1/2}$ units, $SiO_{4/2}$ units, and $(C_6H_5)SiO_{3/2}$ units, and others.

Additionally, organohydrogenpolysiloxane obtained by using a unit represented by the following structure can be also used.

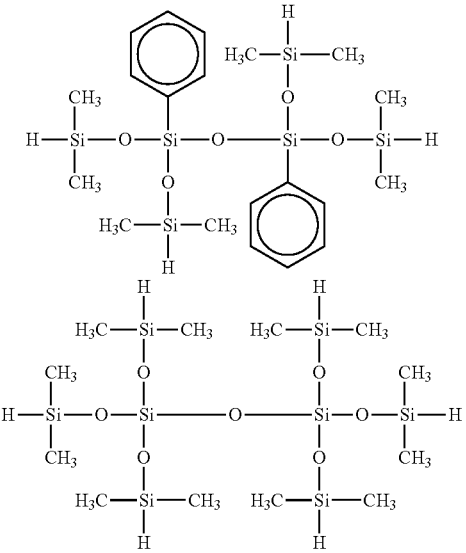

[Chemical Formula 2]

Further, as (B) organohydrogenpolysiloxane, there is one having the following structure.

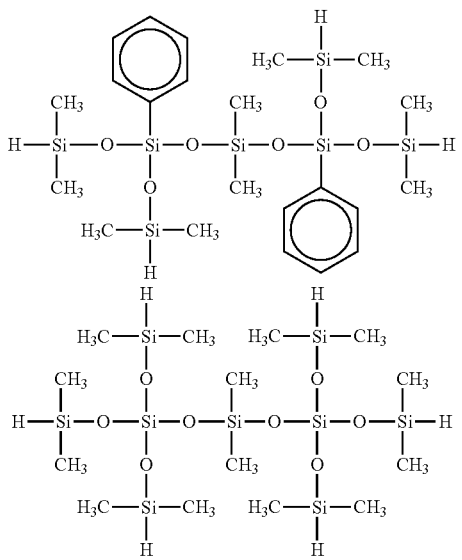

[Chemical Formula 3]

Although a molecular structure of (B) organohydrogenpolysiloxane may be any one of a straight chain type, a cyclic type, a branched type, and a three-dimensional network type, it is preferable for the number of silicon atoms (a polymerization degree in case of a polymer) in one molecule to be 2 or above, more preferable for the same to be 2 to 1,000, and particularly preferable for the same to be approximately 2 to 300.

In regard to a blending quantity of (B) organohydrogenpolysiloxane, it is preferable for the number of silicon atom-bonded hydrogen atoms (SiH groups) in the component (B) to be 0.7 to 3.0 per group having a nonconjugated double bond such as an alkenyl group in the component (A).

Component (C): Platinum-based Catalyst

As the component (C), a platinum-based catalyst is used. As (C) the platinum-based catalyst, there are, e.g., a chloroplatinic acid, a denaturing alcohol chloroplatinic acid, a platinum complex having a chelate structure, and others. One type selected from these catalysts may be solely used, or two or more types may be combined and used.

A blending quantity of (C) the platinum-based catalyst is a curing effective quantity, a so-called catalyst quantity can suffice, and usually the range of 0.1 to 500 ppm per 100 parts by mass which is a total mass of the component (A) and the component (B) is preferable, and the range of 0.5 to 100 ppm is particularly preferable when converted into a mass of a platinum group metal.

Since the uncured resin layer containing the silicon resin serves as a resin layer that seals the semiconductor devices, it is desirable to reduce halogen ions such as chlorine and alkali ions such as sodium as much as possible. Usually, it is preferable for each type of ions to have an amount of 10 ppm or below in extraction at 120° C.

[Mixed Resin Made of Epoxy Resin and Silicone Resin]

As an epoxy resin and a silicone resin contained in the mixed resin, there are the epoxy resins and the silicone resins described above.

Since the uncured resin layer containing the mixed resin serves as a resin layer that seals the semiconductor devices, it is preferable to reduce halogen ions such as chlorine and alkali ions such as sodium as much as possible. Usually, it is preferable for each type of ions to have an amount of 10 ppm or below in extraction at 120° C.

[Inorganic Filler]

An inorganic filler can be blended in the uncured resin layer according to the present invention. As the inorganic filler to be blended, there are, e.g., silica such as molten silica or crystalline silica, alumina, silicon nitride, aluminum nitride, alminosilicate, boron nitride, glass fiber, antimonous trioxide, and others. Average particle diameters or shapes of these inorganic fillers are not restricted in particular.

As the inorganic filler added to the uncured resin layer containing the epoxy resin in particular, a filler previously subjected to a surface treatment using a coupling agent such as a silane coupling agent or a titanate coupling agent may be blended to increase coupling strength of the epoxy resin and the inorganic filler.

As such a coupling agent, it is preferable to use, e.g., epoxy functionalized alkoxysilane such as γ-glycidoxypropyltrimethoxysilane, γ-glycidoxypropylmethyldiethoxysilane, or β-(3,4-epoxycyclohexyl)ethyltrimethoxysilane, amino functionalized alkoxysilane such as N-β(aminoethyl)-γ-aminopropyltrimethoxysilane, γ-aminopropyltriethoxysilane, or N-phenyl-γ-aminopropyltrimethoxysilane, mercapto functionalized alkoxysilane such as γ-mercaptopropyltrimethoxysilane, and others. It is to be noted that a blending quantity of the coupling agent used for a surface treatment and a surface treatment method are not restricted in particular.

When adding to the uncured resin layer constituted of the silicone resin composition, a material obtained by treating a surface of the inorganic filler with the above-described coupling material may be blended.

A preferable blending quantity of the inorganic filler is 100 to 1300 parts by mass and a more preferable blending quantity of the same is 200 to 1000 parts by mass with respect to 100 parts by mass as a total mass of a resin in the epoxy resin composition or the silicone resin composition. 100 parts by mass or above can obtain sufficient strength, and 1300 parts by mass or below enables suppressing a reduction in flowability due to thickening and also suppressing a failure of filling properties due to a reduction in flowability, whereby the semiconductor devices formed on the wafer and the semiconductor devices arranged/mounted on the substrate can be excellently sealed. It is to be noted that made of this inorganic filler in the range of 50 to 95 mass % or especially 60 to 90 mass % in the entire composition constituting the uncured resin layer is preferable.

<Fiber-Containing Resin Substrate>

FIG. 1 shows an example of a cross-sectional view of a fiber-containing resin substrate according to the present invention. A fiber-containing resin substrate 10 according to the present invention has the resin-impregnated fiber base material 1 obtained by impregnating a fiber base material with a thermosetting resin and semi-curing or curing the thermosetting resin and the uncured resin layer 2 containing an uncured thermosetting resin and formed on one side of the resin-impregnated fiber base material.

[Method for Fabricating Fiber-Containing Resin Substrate]

When fabricating the fiber-containing resin substrate according to the present invention using the resin-impregnated fiber base material obtained by impregnating the fiber base material with the thermosetting resin and semi-curing the thermosetting resin, a thermosetting resin such as a thermosetting liquid epoxy resin or silicone resin is further applied to one side of the resin-impregnated fiber base material under reduced pressure or vacuum based on printing or dispensing, and it is heated to form a solid uncured resin layer at 50° C. or below, thereby fabricating the fiber-containing resin substrate.

When using the thermosetting epoxy resin as the thermosetting resin with which the fiber base material is impregnated and adopting the resin-impregnated fiber base material obtained by semi-curing the thermosetting resin to fabricate the fiber-containing resin substrate according to the present invention, it is preferable that the uncured thermosetting resin formed on one side of the resin-impregnated fiber base material is also the epoxy resin. When the thermosetting resin that impregnates the resin-impregnated fiber base material to be semi-cured and the thermosetting resin of the uncured resin layer are the same type of thermosetting resin as described above, the semiconductor devices mounting surface of the substrate having the semiconductor devices mounted thereon or the semiconductor devices forming surface of the wafer having the semiconductor devices formed thereon can be collectively sealed and cured at the same time, and hence a further robust sealing function can be achieved, which is desirable. When the silicone resin is used as the thermosetting resin that impregnates the fiber base material, likewise, it is preferable to use the silicone resin as the uncured thermosetting resin.

When fabricating the fiber-containing resin substrate according to the present invention using the resin-impregnated fiber base material obtained by impregnating the fiber base material with the thermosetting resin and curing the thermosetting resin, the uncured resin layer can be formed by various kinds of methods adopted for the epoxy thermosetting resin or the silicone thermosetting resin in the conventional method, e.g., performing press molding or printing with respect to the uncured thermosetting resin onto one side of the resin-impregnated fiber base material. After the formation, usually, it is preferable to carry out post cure at a temperature of approximately 180° C. for 4 to 8 hours. Besides, as a method for forming the uncured resin layer containing the uncured thermosetting resin on one side of the resin-impregnated base material, the epoxy thermosetting resin or the silicone thermosetting resin that is solid at a room temperature is pressurized while being heated, or an appropriate amount of a polar solvent such as acetone is added to the epoxy resin composition to effect liquefaction, a thin film is formed by printing and the like, and the solvent is removed by, e.g., heating under reduced pressure, thereby uniformly forming the uncured resin layer on one side of the resin-impregnated fiber base material.

The uncured resin layer containing the uncured thermosetting resin having no void or no volatile component and having a thickness of approximately 30 to 500 microns can be formed on one side of the resin-impregnated fiber base material by any method.

[Substrate Having Semiconductor Devices Mounted Thereon and Wafer Having Semiconductor Devices Formed Thereon]

Figure 2:
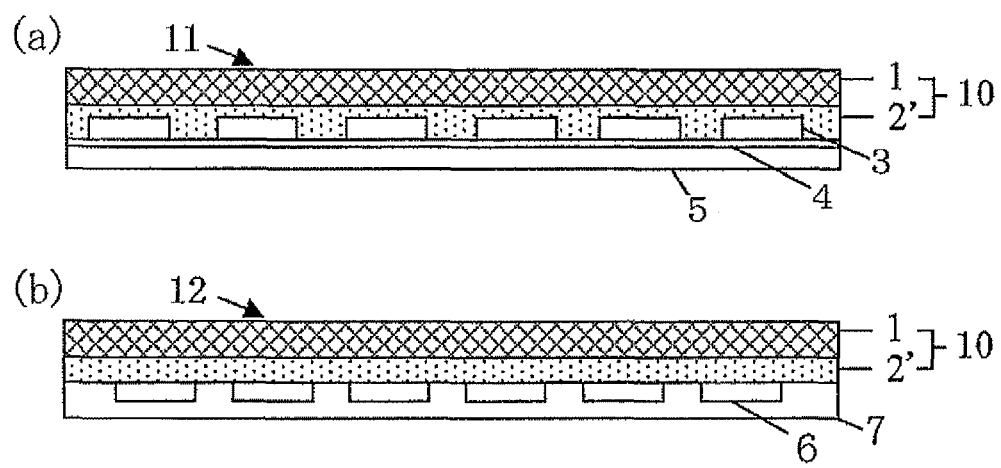
FIG. 2(a) shows an example of a cross-sectional view of a sealed substrate having the semiconductor devices mounted thereon which is sealed with the fiber-containing resin substrate according to the present invention.
FIG. 2(b) shows an example of a cross-sectional view of a sealed wafer having semiconductor devices formed thereon which is sealed with the same.

The fiber-containing resin substrate according to the present invention is a fiber-containing resin substrate for collectively sealing the semiconductor devices mounting surface of the substrate having the semiconductor devices mounted thereon and the semiconductor devices forming surface of the wafer having the semiconductor devices formed thereon. As the substrate having the semiconductor devices mounted thereon, there is, e.g., a substrate having a configuration that one or more semiconductor devices 3 are mounted on an inorganic, metal, or organic substrate 5 through an adhesive 4 shown in FIG. 2(a). Further, as the wafer having the semiconductor devices formed thereon, there is, e.g., a wafer having a configuration that semiconductor devices 6 are formed on a wafer 7 shown in FIG. 2(b). It is to be noted that the substrate having the semiconductor devices mounted thereon includes semiconductor devices array on which semiconductor devices are mounted and aligned, for example.

<Sealed Substrate Having Semiconductor Devices Mounted Thereon and Sealed Wafer Having Semiconductor Devices Formed Thereon>

FIGS. 2(a) and (b) show examples of cross-sectional views the sealed substrate having the semiconductor devices mounted thereon and the sealed wafer having semiconductor devices formed thereon, which are sealed with the fiber-containing resin substrate according to the present invention. In the sealed substrate 11 having semiconductor devices mounted thereon according to the present invention, a semiconductor devices mounting surface of a substrate 5 having semiconductor devices 3 mounted thereon is covered with an uncured resin layers 2 (see FIG. 1) of the fiber-containing resin substrate 10, the uncured resin layer 2 (see FIG. 1) is heated and cured to provide a cured resin layer 2', and the surface is collectively sealed with the fiber-containing resin substrate 10 (FIG. 2(a)). Furthermore, in the sealed wafer 12 having semiconductor devices formed thereon according to the present invention, a semiconductor devices forming surface of a wafer 7 having semiconductor devices 6 formed thereon is covered with the uncured resin layer 2 (see FIG. 1) of the fiber-containing resin substrate 10, the uncured resin layer 2 (see FIG. 1) is heated and cured to provide the cured resin layer 2', and the surface is collectively sealed with the fiber-containing resin substrate 10 (FIG. 2(b)).

As described above, when the semiconductor devices mounting surface of the substrate having the semiconductor devices mounted thereon or the semiconductor devices forming surface of the wafer having the semiconductor devices formed thereon is covered with the uncured resin layer of the fiber-containing resin substrate and the uncured resin layer is heated and cured, the sealed substrate having the semiconductor devices mounted thereon or the sealed wafer having the semiconductor devices formed thereon, which are collectively sealed with the fiber-containing resin substrate, can be a sealed substrate having the semiconductor devices mounted thereon and a sealed wafer having semiconductor devices formed thereon each having a configuration that warp of the substrate or the wafer is suppressed from occurring or the semiconductor devices are suppressed from being delaminated from the substrate.

<Semiconductor Apparatus>

FIGS. 3(a) and (b) show examples of a semiconductor apparatus according to the present invention. A semiconductor apparatus 13 according to the present invention is obtained by dicing the sealed substrate 11 having the semiconductor devices mounted thereon (see FIG. 2) or the sealed wafer 12 having semiconductor devices formed thereon (see FIG. 2) into each piece. As described above, the semiconductor apparatus 13 or 14 that is sealed with the fiber-containing resin substrate having excellent sealing performance such as heat resistance or moisture resistance and is fabricated by dicing the sealed substrate 11 having the semiconductor devices mounted thereon (see FIG. 2) or the sealed wafer 12 having semiconductor devices formed thereon (see FIG. 2), in which warp of the substrate or the wafer and delamination of each semiconductor device 3 from the substrate are suppressed, into each piece can be a high-quality semiconductor apparatus. When the sealed substrate 11 having the semiconductor devices mounted thereon (see FIG. 2(a)) is diced into each piece, the semiconductor apparatus 13 can be a semiconductor apparatus that has the semiconductor devices 3 mounted on the substrate 5 through the adhesive 4 and is sealed with the fiber-containing resin substrate 10 including the cured resin layer 2' and the Resin-impregnated fiber base material 1 from above (FIG. 3(a)). Furthermore, when the sealed wafer 12 having semiconductor devices formed thereon (see FIG. 2(b)) is diced into each piece, the semiconductor apparatus 14 can be a semiconductor apparatus that has the semiconductor devices 6 formed on the wafer 7 and is sealed with the fiber-containing resin substrate 10 including the cured resin layer 2' and the resin-made of fiber base material 1 from above (FIG. 3(b)).

<Method for Manufacturing Semiconductor Apparatus>

Figure 4:
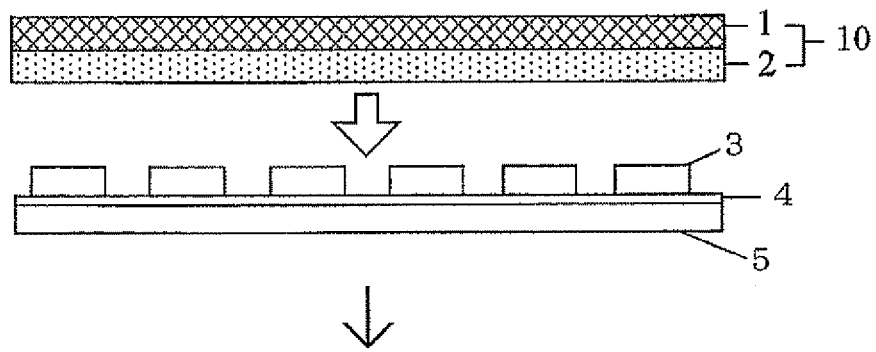
FIG. 4 shows an example of a flowchart of a method for manufacturing a semiconductor apparatus from a substrate having the semiconductor devices mounted thereon using the fiber-containing resin substrate according to the present invention.
Figure 4:
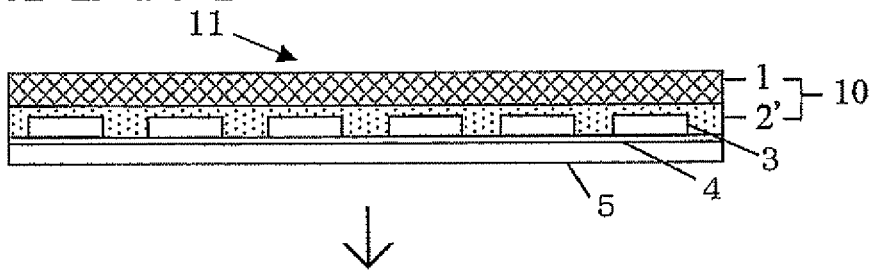
Figure 4:
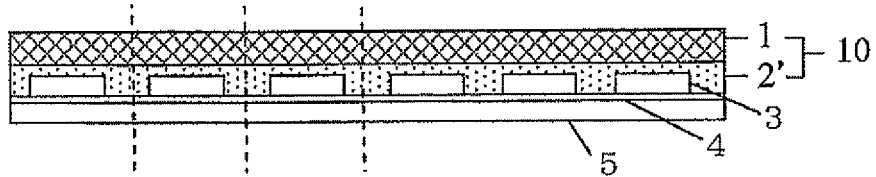
Figure 4:
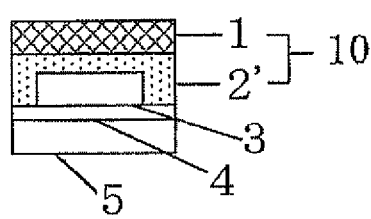

The present invention provides a method for manufacturing a semiconductor apparatus, comprising:

a covering step of covering a semiconductor devices mounting surface of a substrate having the semiconductor devices mounted thereon or a semiconductor devices forming surface of a wafer having semiconductor devices formed thereon with an uncured resin layer of the fiber-containing resin substrate;

a sealing step of collectively sealing the semiconductor devices mounting surface of the substrate having the semiconductor devices mounted thereon or the semiconductor devices forming surface of the wafer having semiconductor devices formed thereon by heating and curing the uncured resin layer to provide a sealed substrate having the semiconductor devices mounted thereon or a sealed wafer having semiconductor devices formed thereon; and a piece forming step of dicing the sealed substrate having the semiconductor devices mounted thereon or the sealed wafer having semiconductor devices formed thereon into each piece to manufacture the semiconductor apparatus. The method for manufacturing a semiconductor apparatus according to the present invention will now be described hereinafter with reference to FIG. 4.

[Covering Step]

The covering step according to the method for manufacturing a semiconductor apparatus according to the present invention is a step of covering the semiconductor devices mounting surface of the substrate 5 having the semiconductor devices 3 mounted thereon through the adhesive 4 or the semiconductor devices forming surface of the wafer (not shown) having the semiconductor devices (not shown) formed thereon with the uncured resin layer 2 in the fiber-containing resin substrate 10 having the resin-impregnated fiber base material 1 and the uncured resin layer 2 (FIG. 4(A)).

[Sealing Step]

The sealing step according to the method for manufacturing a semiconductor apparatus of the present invention is a step of heating and curing the uncured resin layer 2 in the fiber-containing resin substrate 10 to provide the cured resin layer 2' and thereby collectively sealing the semiconductor devices mounting surface of the substrate 5 having each semiconductor device 3 mounted thereon or the semiconductor devices forming surface of the wafer (not shown) having each semiconductor device (not shown) formed thereon to provide the sealed substrate 11 having the semiconductor devices mounted thereon or the sealed wafer (not shown) having semiconductor devices formed thereon (FIG. 4(B)).

[Piece Forming Step]

Figure 3:
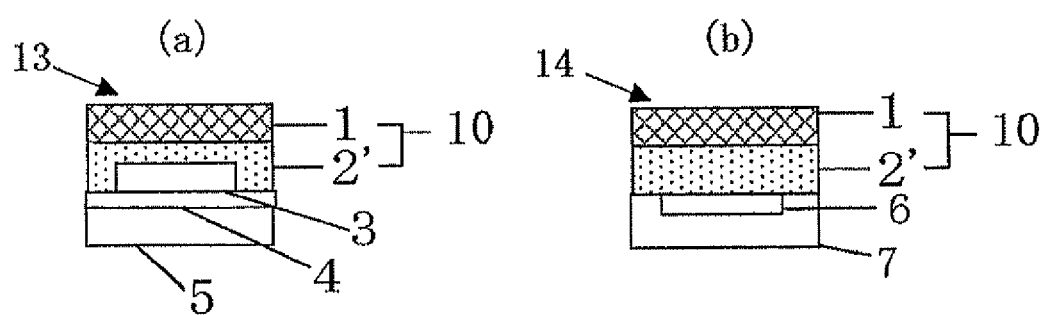
FIG. 3(a) shows an example of a cross-sectional view of a semiconductor apparatus according to the present invention fabricated from the sealed substrate having semiconductor devices mounted thereon.
FIG. 3(b) shows an example of a cross-sectional view of a semiconductor apparatus according to the present invention fabricated from the sealed wafer having semiconductor devices formed thereon.

The piece forming step according to the method for manufacturing a semiconductor apparatus of the present invention is a step of dicing the sealed substrate 11 having the semiconductor devices mounted thereon or the wafer (not shown) having semiconductor devices formed thereon into each piece, thereby manufacturing the semiconductor apparatus 13 or 14 (see FIG. 3(*b*)) (FIGS. 4(C) and (D)).

Specific description will now be given hereinafter. At the covering step and the sealing step, when, e.g., a vacuum laminator apparatus for use in lamination of a solder resist film, various kinds of insulator films, and others is adopted, covering and sealing without void and warp can be carried out. As a method of lamination, it is possible to adopt any method, e.g., roll lamination, diaphragm type vacuum lamination, air-pressure lamination, and others. Among others, using both the vacuum lamination and the air-pressure method is preferable.

Here, description will be given as to an example of using the vacuum lamination apparatus manufactured by Nichigo-Morton Co., Ltd. to seal a silicon wafer having a thickness of 250 microns and a diameter of 300 mm (12 inches) with a fiber-containing resin substrate having a silicone resin-impregnated fiber base material obtained by impregnating glass cloth (a fiber base material) having a thickness of 50 microns with a silicone resin and an uncured resin layer containing an uncured thermosetting silicone resin having a thickness of 50 microns on one side thereof.

In plates that have upper and lower built-in heaters and are set to 150° C., the upper plate has a diaphragm rubber appressed against the heater under reduced pressure. A silicon wafer of 300 mm (12 inches) is set on the lower plate, the fiber-containing resin substrate is set on one side of this silicon wafer so that the uncured resin layer surface can fit to a semiconductor forming surface of the silicon wafer. Then, the lower plates is moved up, the upper and lower plates are closely attached to each other to form a vacuum chamber by an O-ring installed so as to surround the silicon wafer set on the lower plate, and a pressure in the vacuum chamber is reduced. When the pressure in the vacuum chamber is sufficiently reduced, a valve of a pipe communicating with a vacuum pump from a space between the diaphragm of the upper plate and the heater is closed to send compressed air. As a result, the upper diaphragm rubber inflates to sandwich the silicon wafer and the fiber-containing resin substrate between the upper diaphragm rubber and the lower plate, and vacuum lamination and curing of the thermosetting silicone resin simultaneously advance, and sealing is completed. A curing time of approximately 3 to 20 minutes is enough. When the vacuum lamination is terminated, the pressure in the vacuum chamber is restored to a normal pressure, the lower plate is moved down, and the sealed silicon wafer is taken out. The wafer without void or warp can be sealed by the above-described process. The taken-out silicon wafer is usually subjected to post cure at a temperature of 150 to 180° C. for 1 to 4 hours, thereby stabilizing electrical characteristics or mechanical characteristics.

The covering and sealing steps using the vacuum lamination apparatus are not restricted to the illustrated silicone resin, and they can be also used for the epoxy resin or a mixed resin of epoxy and silicone.

According to such a method for manufacturing a semiconductor apparatus, the semiconductor devices mounting surface or the semiconductor devices forming surface can be easily coated with the uncured resin layer of the fiber-containing resin substrate without a filling failure at the covering step. Further, since the fiber-containing resin substrate is used, the resin-impregnated fiber base material can suppress contraction stress of the uncured resin layer at the timing of curing, the semiconductor devices mounting surface or the semiconductor devices forming surface can be thereby collectively sealed at the sealing step, and the sealed substrate having the semiconductor devices mounted thereon or the sealed wafer having semiconductor devices formed thereon, in which warp of the substrate or wafer and delamination of the semiconductor devices from the substrate are suppressed, can be obtained even though the thin large-diameter wafer or the thin large-diameter substrate made of a metal and the like is collectively sealed. Furthermore, at the piece forming step, the sealed substrate having the semiconductor devices mounted thereon or the sealed wafer having semiconductor devices formed thereon, which is sealed with the fiber-containing resin substrate having excellent sealing performance such as heat resistance or moisture resistance and suppressed from warping, can be diced into each piece as the semiconductor apparatus, thereby providing the method for manufacturing a semiconductor apparatus that enables manufacturing the high-quality semiconductor apparatus.

EXAMPLES

The present invention will now be described in more detail hereinafter with reference to synthesis examples of the silicone resin used as the thermosetting resin of the fiber-containing resin substrate and examples and comparative examples of the method for manufacturing a semiconductor apparatus using the fiber-containing resin substrate according to the present invention, but the present invention is not restricted thereto.

Synthesis of Organosilicon Compound Having Nonconjugated Double Bond

Synthesis Example 1

Organosilicon Compound (A1) Having Nonconjugated Double Bond 27 mol of organosilane represented as $PhSiCl_3$, 1 mol of $ClMe_2SiO(Me_2SiO)_{33}SiMe_2Cl$, and 3 mol of $MeViSiCl_2$ were dissolved in a toluene solvent, dropped into wafer, co-hydrolized, rinsed, neutralized by alkali cleaning, and dehydrated, and then the solvent was stripped to synthesize an organosilicon compound (A1) having a nonconjugated double bond. A composition ratio of a constituent unit of this compound is represented by an expression: $[PhSiO_{3/2}]_{0.27}[-SiMe_2O-(Me_2SiO)_{33}-SiMe_2O-]_{0.01}[MeViSiO_{2/2}]_{0.03}$. A weight-average molecular weight of this compound was 62,000, and a melting point of the same was 60° C. It is to be noted that Me in the composition formula denote a methyl group, Ph in the composition formula denote a phenyl group and Vi in the composition formula denotes a vinyl group represented as ($-CH=CH_2$).

Synthesis of Organohydrorgenpolysiloxane

Synthesis Example 2

Organohydrorgenpolysiloxane (B1)

27 mol of organosilane represented as $PhSiCl_3$, 1 mol of $ClMe_2SiO(Me_2SiO)_{33}SiMe_2Cl$, and 3 mol of $MeHSiCl_2$ were dissolved in a toluene solvent, dropped into wafer, co-hydrolized, rinsed, neutralized by alkali cleaning, and dehydrated, and then the solvent was stripped to synthesize organohydrogenpolysiloxane (B1). A composition ratio of a constituent unit of this resin is represented by an expression: $[PhSiO_{3/2}]_{0.27}[-SiMe_2O-(Me_2SiO)_{33}-SiMe_2O-]_{0.01}[MeHSiO_{2/2}]_{0.03}$. A weight-average molecular weight of this resin was 58,000, and a melting point of the same was 58° C.

Example 1

Fabrication of Resin-Impregnated Fiber Base Material 189 g of the organosilicon compound (A1) having a non-conjugated double bond obtained in Synthesis Example 1, 189 g of organohydrogenpolysiloxane (B1) obtained in Synthesis Example 2, 0.2 g of acetylene alcohol-based ethynyl-cyclohexanol as a reaction inhibitor, and 0.1 g of an octyl alcohol solution having 1 mass % of a chloroplatinic acid were added and well agitated by a planetary mixer heated to 60° C. to obtain a base composition. 400 g of toluene as a solvent was added to this base composition, and 378 g of silica (a trade name: Admafine E5/24C, an average particle diameter: approximately 3 µm, manufactured by Admatechs Co., Ltd.) as an inorganic filler was added to prepare a toluene dispersion liquid of the silicone resin composition.

When quartz glass cloth (manufactured by Shin-Etsu Quartz Products Co., Ltd., a thickness: 50 µm) as a fiber base material was immersed in the toluene dispersion liquid of the silicone resin composition, the glass cloth was impregnated with the toluene dispersion liquid. The glass cloth was left at 60° C. for 2 hours to volatilize toluene. A film that is solid at a room temperature (25° C.) was formed on each of both surfaces of the quartz glass cloth after volatilizing toluene. The glass cloth was subjected to pressure forming by a hot pressing machine at 150° C. for 10 minutes to obtain a molded product, and this product was further subjected to secondary curing at 150° C. for 1 hours, whereby a silicone resin-impregnated fiber base material (I-a) having the cured impregnating thermosetting resin was obtained.

Further, when quartz glass cloth (manufactured by Shin-Etsu Quartz Products Co., Ltd., a thickness: 50 µm) as a fiber base material was immersed in the toluene dispersion liquid of the silicone resin composition, the glass cloth was impregnated with the toluene dispersion liquid, and the glass cloth was left at 60° C. for 2 hours to volatilize toluene, thereby obtaining a silicone resin-impregnated fiber base material (II-a) having the semi-cured impregnating thermosetting resin. A film that is solid at a room temperature (25° C.) was formed on each of both surfaces of the quartz glass cloth after volatilizing toluene.

[Fabrication of Composition for Forming Uncured Resin Layer Containing Uncured Thermosetting Resin]

350 parts by mass of spherical silica having an average particle diameter of 5 µm were added to a composition having 50 parts by mass of the organosilicon compound (A1) having a nonconjugated double bond, 50 parts by mass of organohydrogenpolysiloxane (B1), 0.2 part by mass of acetylene alcohol-based ethynylcyclohexanol, and 0.1 part by mass of an octyl alcohol denatured solution of a chloroplatinic acid added thereto, and this mixture was well agitated by the planetary mixer heated to 60° C. to prepare a silicone resin composition (I-b). This composition is solidified at a room temperature (25° C.).

[Fabrication of Fiber-Containing Resin Substrate]

The silicone resin composition (I-b) was sandwiched between the silicone resin-impregnated fiber base material (I-a) having the cured impregnating thermosetting resin (an expansion coefficient: 10 ppm in an x-y axis direction) and a PET film (a release film) coated with a fluorine resin, and compression molding was carried out using a hot press apparatus at 80° C. under a pressure of 5 t for 5 minutes to fabricate a fiber-containing resin substrate (I-c) having an uncured resin layer containing the uncured thermosetting resin with a thickness of 50 µm formed on one side of the silicone resin-impregnated fiber base material (I-a). Then, this substrate was cut into a circular shape having a diameter of 300 mm (12 inches).

[Covering and Sealing of Wafer Having Semiconductor Devices Formed Thereon]

Subsequently, the vacuum lamination apparatus manufactured by Nichigo-Morton Co., Ltd. set to 130° C. as a plate temperature was used to perform covering and sealing. First, a silicon wafer having a diameter of 300 mm (12 inches) and a thickness of 125 microns was set on the lower plate, and this wafer was covered from above while setting the silicone resin composition (I-b) surface, which is the uncured resin layer of the fiber-containing resin substrate (I-c) having the release film removed therefrom, with respect to a silicon wafer surface. Thereafter, the plate was closed to effect vacuum compression molding for 5 minutes to carry out curing and sealing. After the curing and sealing, the silicon wafer sealed with the fiber-containing resin substrate (I-c) was further subjected to post cure at 150° C. for 2 hours, thereby obtaining a sealed wafer (I-d) having semiconductor devices formed thereon.

Example 2

Fabrication of Composition for Forming Uncured Resin Layer Containing Uncured Thermosetting Resin 350 parts by mass of spherical silica having an average particle diameter of 5 µm were added to a composition having 50 parts by mass of the organosilicon compound (A1) having a nonconjugated double bond, 50 parts by mass of organohydrogenpolysiloxane (B1), 0.2 part by mass of acetylene alcohol-based ethynylcyclohexanol, and 0.1 part by mass of an octyl alcohol denatured solution of a chloroplatinic acid added thereto, and this mixture was well agitated by the planetary mixer heated to 60° C. to prepare a silicone resin composition (II-b). This composition was solid at a room temperature (25° C.)

[Fabrication of Fiber-Containing Resin Substrate]

The silicone resin composition (II-b) was sandwiched between the silicon resin-impregnated fiber base material (II-a) having the semi-cured impregnating thermosetting resin (an expansion coefficient: 10 ppm in the x-y axis direction) and a PET film (a release film) coated with a fluorine resin, and compression molding was carried out using a hot press apparatus at 80° C. under a pressure of 5 t for 5 minutes to fabricate a fiber-containing resin substrate (II-c) having an uncured resin layer containing the uncured thermosetting resin with a thickness of 50 μm formed on one side of the silicone resin-impregnated fiber base material (II-a). Then, this substrate was cut into a circular shape having a diameter of 300 mm (12 inches).

[Covering and Sealing of Wafer Having Semiconductor Devices Formed Thereon]

Subsequently, the vacuum lamination apparatus manufactured by Nichigo-Morton Co., Ltd. set to 130° C. as a plate temperature was used to perform covering and sealing. First, a silicon wafer having a diameter of 300 mm (12 inches) and a thickness of 125 microns was set on the lower plate, and this wafer was covered from above while setting the silicone resin composition (II-b) surface, which is the uncured resin layer of the fiber-containing resin substrate (II-c) having the release film removed therefrom, with respect to a silicon wafer surface. Thereafter, the plate was closed to effect vacuum compression molding for 5 minutes to carry out curing and sealing. After the curing and sealing, the silicon wafer sealed with the fiber-containing resin substrate (II-c) was further subjected to post cure at 150° C. for 2 hours, thereby obtaining a sealed wafer (II-d) having semiconductor devices formed thereon.

Example 3

Fabrication of Resin-impregnated Fiber Base Material

A BT (bismaleimide triazine) resin substrate (a glass transition temperature: 185° C.) with a thickness of 70 microns that includes glass cloth as a fiber base material and has spherical silica with a particle diameter of 0.3 micron added thereto to adjust an expansion coefficient (x and y axes) to 7 ppm was prepared as a resin-impregnated fiber base material (III-a).

[Fabrication of Composition for Forming Uncured Resin Layer Containing Uncured Thermosetting Resin]

60 parts by mass of a cresol novolac-type epoxy resin (EOCN1020 manufactured by Nippon Kayaku Co., Ltd), 30 parts by mass of a phenol novolac resin (H-4 manufactured by Gun Ei Chemical Industry Co., Ltd.), 400 parts by mass of spherical silica (an average particle diameter: 7 microns, manufactured by Tatsumori Ltd.), 0.2 part by mass of catalytic TPP (triphenylphosphine, manufactured by Hokko Chemical Industry), and 0.5 part by mass of a silane coupling material (KBM403 manufactured by Shin-Etsu Chemical Co., Ltd.) were sufficiently mixed using a high-speed mixing apparatus, then heated and kneaded by a continuous kneader to be formed into a sheet, and cooled. The sheet was smashed to obtain an epoxy resin composition (III-b) as granular powder.

[Fabrication of Fiber-Containing Resin Substrate]

The resin-impregnated fiber base material (III-a) was set on a lower die of a compression molding apparatus that can perform hot compression under reduced pressure, and the granular powder of the epoxy resin composition (III-b) was uniformly dispersed thereon. A temperature of upper and lower dies were set to 80° C., a PET film (a release film) coated with a fluorine resin was set in the upper die, a pressure in the dies was reduced to a vacuum level, compression molding was carried out for 3 minutes so as to have a resin thickness of 80 microns, thereby fabricating a fiber-containing resin substrate (III-c). After the molding, this substrate was cut into a circular shape having a diameter of 300 mm (12 inches).

[Covering and Sealing of Wafer Having Semiconductor Devices Formed Thereon]

Subsequently, the vacuum lamination apparatus manufactured by Nichigo-Morton Co., Ltd. and set to 170° C. as a plate temperature was used to perform covering and sealing. First, a silicon wafer having a diameter of 300 mm (12 inches) and a thickness of 125 microns was set on the lower plate, and this wafer was coated from above while setting the epoxy resin composition (III-b) surface, which is the uncured resin layer of the fiber-containing resin substrate having the release film removed therefrom, with respect to a silicon wafer surface. Thereafter, the plate was closed to effect vacuum compression molding for 5 minutes to carry out curing and sealing. After the curing and sealing, the silicon wafer was further subjected to post cure at 170° C. for 4 hours, thereby obtaining a sealed wafer (III-d) having semiconductor devices formed thereon.

Example 4

Substrate Having Semiconductor Devices Mounted Thereon 400 silicon chips (a shape: 5 mm×7 mm, a thickness: 125 microns) as semiconductor devices formed into respective pieces were aligned and mounted on a metal substrate having a diameter of 200 mm (8 inches) and a thickness of 500 microns through an adhesive whose adhesive strength is lowered at a high temperature.

[Covering and Sealing of Substrate Having Semiconductor Devices Mounted Thereon]

This metal substrate was coated and sealed using the vacuum lamination apparatus manufactured by Nichigo-Morton Co., Ltd. and set to 170° C. as a plate temperature. First, the metal substrate was set on the lower plate, and a fiber-containing resin substrate (IV-c) fabricated like Example 3 was cut into a circular shape having a diameter of 200 mm (8 inches). A lamination film was removed, and the covering was performed while setting an epoxy resin composition (IV-b) surface, which is the uncured resin layer of the fiber-containing resin substrate (IV-c), with respect to a semiconductor devices mounting surface on the upper side of the metal substrate. Thereafter, the plate was closed to effect vacuum compression molding for 5 minutes to carry out curing and sealing so as to have a resin thickness of 50 microns on the silicon chips. After the curing and sealing, the substrate was further subjected to post cure at 170° C. for 4 hours, thereby obtaining a sealed substrate (IV-d) having the semiconductor devices mounted thereon.

Comparative Example 1

350 parts by mass of spherical silica having an average particle diameter of 5 μm were added to a composition having 50 parts by mass of the organosilicon compound (A1) having a nonconjugated double bond, 50 parts by mass of organohydrogenpolysiloxane (B1), 0.2 part by mass of acetylene alcohol-based ethynylcyclohexanol as a reaction inhibitor, and 0.1 part by mass of an octyl alcohol denatured solution of a chloroplatinic acid added thereto, and this mixture was well agitated by the planetary mixer heated to 60° C. to prepare a silicone resin composition (V-a). This composition was solid at 25° C.

[Fabrication of Sealing Sheet]

The silicone resin composition (V-a) was sandwiched between a PET film (a pressurization base film) and a PET film (a release film) coated with a fluorine resin, and compression molding was carried out using a hot press apparatus at 80° C. under a pressure of 5 t for 5 minutes, and the composition was molded into a film-like shape having a thickness of 50 μm to fabricate a sealing sheet (V-c) made of the silicone resin composition (V-a) alone. After the molding, the sheet was cut into a circular shape having a diameter of 300 mm (12 inches).

[Covering and Sealing of Wafer Having Semiconductor Devices Formed Thereon]

Subsequently, the vacuum lamination apparatus manufactured by Nichigo-Morton Co., Ltd. and set to 130° C. as a plate temperature was used to perform covering and sealing. First, a silicon wafer having a diameter of 300 mm (12 inches) and a thickness of 125 microns was set on the lower plate, and the sealing sheet (V-c) made of the silicone resin composition (V-a) alone having the release film removed therefrom was laminated thereon. Thereafter, the PET film (the pressurization base film) was also delaminated, then the plate was closed, and vacuum compression molding was effected for 5 minutes to carry out curing and sealing. After the curing and sealing, the wafer was further subjected to post cure at 150° C. for 2 hours, thereby obtaining a sealed wafer (V-d) having semiconductor devices formed thereon.

Comparative Example 2

Substrate Having Semiconductor Devices Mounted Thereon 400 silicon chips (a shape: 5 mm×7 mm, a thickness: 125 microns) as semiconductor devices formed into respective pieces were aligned and mounted on a metal substrate having a diameter of 300 mm (8 inches) and a thickness of 500 microns through an adhesive whose adhesive strength is lowered at a high temperature.

[Covering and Sealing of Substrate Having Semiconductor Devices Mounted Thereon]

This substrate was set on a lower die of a compression molding apparatus that can perform hot compression under reduced pressure, and granular powder of an epoxy resin composition (VI-b) fabricated like Example 3 was uniformly dispersed thereon. A temperature of upper and lower dies were set to 170° C., a PET film (a release film) coated with a fluorine resin was set in the upper die, a pressure in the dies was reduced to a vacuum level, and compression molding was carried out for 3 minutes so as to have a resin thickness of 50 microns, thus effecting curing and sealing. After the curing and sealing, posture cure was conducted at 170° C. for 4 hours to obtain a sealed substrate (VI-d) having the semiconductor devices mounted thereon.

Warp, appearances, an adhesion state of the resin and the substrate, whether each semiconductor device has been delaminated from the metal substrate were checked with respect to the sealed wafers (I-d) to (III-d), and (V-d) having semiconductor devices formed thereon and the sealed substrates (IV-d) and (VI-d) having semiconductor devices mounted thereon sealed in Examples 1 to 4 and Comparative Examples 1 and 2 as described above. Table 1 shows results. Here, in regard to the appearance, presence/absence of voids and an unfilled state was checked, and the appearance was determined to be excellent when these factors were not found. Moreover, as to the adhesion state, the adhesion state was determined to be excellent when delamination did not occur at the time of molding.

TABLE 1

|  | EXAMPLE 1 | EXAMPLE 2 | EXAMPLE 3 | EXAMPLE 4 | COMPARATIVE EXAMPLE 1 | COMPARATIVE EXAMPLE 2 |
| --- | --- | --- | --- | --- | --- | --- |
| APPEARANCE | EXCELLENT | EXCELLENT | EXCELLENT | EXCELLENT | EXCELLENT | EXCELLENT |
| WARP OF SUBSTRATE (mm) | 0.3 | 0.4 | 0.7 | 0.6 | 12 | 8 |
| ADHESION STATE | EXCELLENT | EXCELLENT | EXCELLENT | EXCELLENT | EXCELLENT | EXCELLENT |
| APPEARANCE (VOID) | NONE | NONE | NONE | NONE | NONE | SMALL VOID |
| APPEARANCE (UNFILLED) | NONE | NONE | NONE | NONE | NONE | NONE |
| SUBSTRATE | SILICON WAFER | SILICON WAFER | SILICON WAFER | METAL SUBSTRATE | SILICON WAFER | METAL SUBSTRATE |
| DELAMINATION OF SEMICONDUCTOR DEVICE FROM SUBSTRATE | — | — | — | NONE | — | DELAMINATED |

Additionally, each of the sealed substrates having semiconductor devices mounted thereon and the sealed wafers having semiconductor devices formed thereon in Examples 1 to 4 and Comparative Examples 1 and 2 was diced into each piece, and the following heat resistance test and moisture resistance test were conducted. In the heat resistance state, a heat cycle test was performed with respect to a test piece (the test piece was maintained at −25° C. for 10 minutes, and it is maintained at 125° C. for 10 minutes, and this cycle was repeated for 1000 times) to evaluate whether electrical conduction can be achieved after the test. Further, in the moisture resistance test, a direct-current voltage of 10 V was applied to both poles of a circuit of this test piece under conditions of a 85° C. temperature and 850 relative humidity to evaluate whether a short circuit occurs using a migration tester (manufactured by IMV Corporation, MIG-86). As a result, it was revealed that Examples 1 to 4 and Comparative Examples 1 and 2 have no difference and have excellent heat resistance and moisture resistance.

Based on the above results, as shown by Comparative Examples 1 and 2 using no resin-impregnated fiber base material according to the present invention, it was found out that, when the semiconductor devices mounting surface of the substrate having the semiconductor devices mounted thereon or the semiconductor devices forming surface of the wafer having semiconductor devices formed thereon are collectively sealed in these comparative examples, the sealed wafer (V-d) having semiconductor devices formed thereon and the sealed substrate (VI-d) having the semiconductor devices mounted thereon to be fabricated greatly warp and the semiconductor devices are delaminated from the substrate (Table 1). On the other hand, as shown by the examples, in the sealed wafers (I-d) to (III-d) having semiconductor devices formed thereon and the sealed substrate (IV-d) having the semiconductor devices mounted thereon which are sealed with the fiber-containing resin substrate according to the present invention, it was found out that warp of the substrate is greatly suppressed, the appearance and the adhesion state are excellent, and voids or unfilled states are not produced either. Therefore, the resin-impregnated fiber base material according to the present invention can suppress contraction stress when curing the uncured resin layer, whereby warp of the substrate or the wafer and delamination of the semiconductor devices from the substrate can be suppressed.

It is to be noted that the present invention is not restricted to the foregoing embodiment. The foregoing embodiment is an example, and examples that have substantially the same configuration and exercise the same functions and effects as those in the technical concept described in claims according to the present invention are included in the technical scope of the present invention.

What is claimed is:

1. A fiber-containing resin first substrate for collectively sealing at least one semiconductor device mounting surface of a second substrate having at least one semiconductor device mounted thereon or at least one semiconductor device forming surface of a wafer having at least one semiconductor device formed thereon, comprising:
    a two-layered structure consisting of a resin-impregnated fiber base material obtained by impregnating a fiber base material with a thermosetting resin and semi-curing or curing the thermosetting resin, and an uncured resin layer containing an uncured thermosetting resin and formed on one side of the resin-impregnated fiber base material,
        wherein a thickness of the uncured resin layer is not smaller than 20 microns and not realer than 200 microns.

2. The fiber-containing resin first substrate according to claim 1, wherein an expansion coefficient of the resin-impregnated fiber base material in an X-Y direction is not lower than 3 ppm and not greater than 15 ppm.

3. The fiber-containing resin first substrate according to claim 1, wherein the uncured resin layer contains any one of an epoxy resin, a silicone resin, and a mixed resin of epoxy and silicone that are solidified at a temperature less than 50° C. and molten at 50° C. or above and 150° C. or below.

4. The fiber-containing resin first substrate according to claim 2, wherein the uncured resin layer contains any one of an epoxy resin, a silicone resin, and a mixed resin of epoxy and silicone that are solidified at a temperature less than 50° C. and molten at 50° C. or above and 150° C. or below.

5. A sealed substrate having at least one semiconductor device mounted thereon,
    wherein the sealed substrate having the at least one semiconductor device mounted thereon is collectively sealed with the fiber-containing resin first substrate according to claim 1 by covering the at least one semiconductor device mounting surface of the second substrate having the at least one semiconductor device mounted thereon with the uncured resin layer of the fiber-containing resin first substrate and heating and curing the uncured resin layer.

6. A sealed wafer having at least one semiconductor device formed thereon,
    wherein the sealed wafer having the at least one semiconductor device formed thereon is collectively sealed with the fiber-containing resin first substrate according to claim 1 by covering the at least one semiconductor device forming surface of the wafer having the at least one semiconductor device formed thereon with the uncured resin layer of the fiber-containing resin first substrate and heating and curing the uncured resin layer.

7. A semiconductor apparatus,
    wherein the semiconductor apparatus is obtained by dicing the sealed substrate having the at least one semiconductor device mounted thereon according to claim 5 into each piece.

8. A semiconductor apparatus,
    wherein the semiconductor apparatus is obtained by dicing the sealed wafer having the at least one semiconductor device formed thereon according to claim 6 into each piece.

* * * * *